United States Patent [19]

Saito et al.

[11] Patent Number: 5,085,947
[45] Date of Patent: Feb. 4, 1992

[54] ELECTROLUMINESCENCE DEVICE

[75] Inventors: Shogo Saito, Fukuoka; Tetsuo Tsutui, Kasuga; Chihaya Adachi, Oonojyo, all of Japan

[73] Assignee: Ricoh Company, Ltd., Tokyo, Japan

[21] Appl. No.: 459,326

[22] Filed: Dec. 29, 1989

[30] Foreign Application Priority Data

Mar. 23, 1989 [JP] Japan .................................. 1-072767

[51] Int. Cl.$^5$ .............................................. H01J 1/62
[52] U.S. Cl. .................................... 428/690; 313/504; 313/507; 428/917
[58] Field of Search ................. 428/690, 917; 313/504, 313/507

[56] References Cited

U.S. PATENT DOCUMENTS

| | | | |
|---|---|---|---|
| 4,720,432 | 1/1988 | Van Slyke et al. | 428/917 |
| 4,769,292 | 9/1988 | Tang et al. | 428/917 |
| 4,885,211 | 12/1989 | Tang et al. | 428/917 |

Primary Examiner—James J. Seidleck
Attorney, Agent, or Firm—Oblon, Spivak, McClelland, Maier & Neustadt

[57] ABSTRACT

An electroluminescence device containing a first organic compound having positive-hole-transporting and luminous properties, such as a triphenyl amine compound, a stilbene derivative or a pyrazoline derivative, and a second organic compound having electron-transporting property, such as an oxadiazole derivative, in its luminescence layer interposed between a pair of electrodes.

12 Claims, 1 Drawing Sheet

ELECTROLUMINESCENCE DEVICE

BACKGROUND OF THE INVENTION

1. Field of the Invention

This invention relates to an electroluminescence device comprising a luminescence layer comprising (i) an organic compound having positive-hole-transporting and luminous properties and (ii) an organic compound having electron-transporting property, capable of directly converting electric energy to photo-energy under application of a voltage thereto, and providing a light emitting device having a luminescent plane surface larger than those of an incandescent lamp, a fluorescent lamp or a light emitting diode.

2. Discussion of Background

Electroluminescence devices are classified into two types depending on the exciting mechanism for the emission of light: 1) an intrinsic electroluminescence device, in which electrons and positive holes migrate locally in the luminescence layer to excite a luminescent material contained therein, capable of emitting light only in an alternating electric field, and 2) a carrier injection type electroluminescence device, in which electrons and positive holes are injected by electrodes and recombined with each other in the luminescence layer to excite a luminescent material, capable of emitting light only in a direct electric field.

In general, the intrinsic electroluminescence device contains a luminescent material made of an inorganic compound such as ZnS to which Mn or Cu is added. The electroluminescence device of this type has the drawback that a high alternating electromotive force of 100V or more is required for the operation thereof. In addition, this device is disadvantageous in that it requires high production cost, emits light with low luminous intensity, and has low durability.

On the other hand, the carrier injection type electroluminescence device has a luminescence layer made of a thin layer of an organic compound and can emit light with high luminous intensity. For instance, electroluminescence devices which emit green light are disclosed in Japanese Laid-Open Patent Application 59-194393 and U.S. Pat. No. 4,720,432, and an electroluminescence device which emits yellow light is reported in Jpn. Journal of Applied Physics, Vol. 27, Pages 713-715. These electroluminescence devices can emit light with high luminous intensity in a direct electric field even when a low electromotive force of 100V or less is applied thereto.

However, in general, an electron-transporting layer also serves as a luminescence layer in the carrier injection type electroluminescence device. Therefore, there is a limitation to the material which can be used for the luminescence layer. In addition, the durability of the conventional electroluminescence devices of this type is not sufficient yet.

SUMMARY OF THE INVENTION

Accordingly, an object of the present invention is to provide an electroluminescence device which can be readily produced, can emit light with high luminous intensity, and can maintain the light-emitting characteristics for a prolonged period of time.

The object of the present invention can be attained by an electroluminescence device comprising a substrate, a first electrode formed on the substrate, a luminescence layer formed on the first electrode, comprising a first organic compound having positive-hole-transporting and luminous properties and a second organic compound having electron-transporting property, and a second electrode formed on the luminescence layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Referring now to the accompanying drawings, the present invention will be explained in detail.

Figure 1:
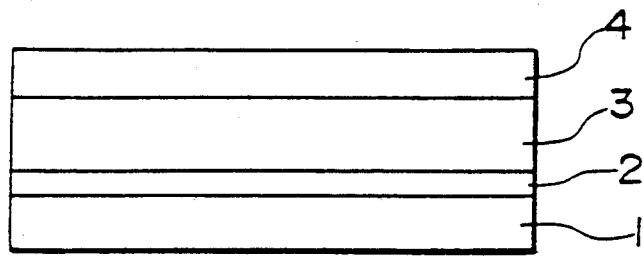
FIG. 1 is a schematic cross-sectional view of an example of an electroluminescence device according to the present invention.

FIG. 1 is a schematic cross-sectional view of an example of an electroluminescence device according to the present invention. In this figure, reference numeral 1 designates a substrate made of glass or of a synthetic resin, and reference numeral 2 designates a first (or positive) electrode. The first electrode 2 can be provided on the substrate 1 by depositing in vacuum or sputtering a metal such as gold, platinum or palladium, or providing a thin layer of tin oxide, indium—tin oxide or an organic electroconductive material. It is preferable that the electrode 2 be transparent to light of 400 nm or more. Reference numeral 3 designates a luminescence layer made of a thin layer comprising a first organic compound having positive-hole-transporting and luminous properties, and a second organic compound having electron-transporting property. The thickness of the luminescence layer 3 is generally 200 Å to 3000 Å, preferably 400 Å to 1500 Å. The weight ratio of these two organic compounds in the luminescence layer 3 can be changed from 10/90 to 90/10.

Figure 2:
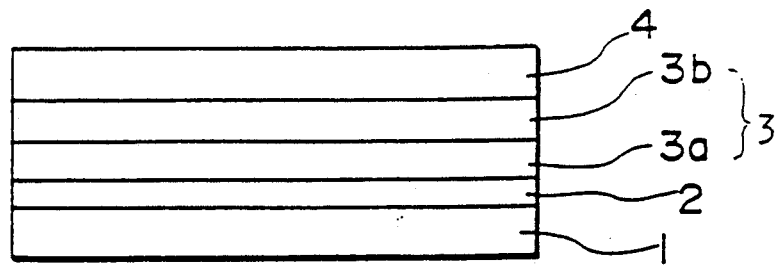
FIG. 2 is a schematic cross-sectional view of another example of an electroluminescence device according to the present invention.

In the present invention, the luminescence layer can also be composed of a first layer comprising the first organic compound having positive-hole-transporting and luminous properties and a second layer comprising the second organic compound having electron-transporting property as illustrated in FIG. 2.

In FIG. 2, reference numerals 1 and 2 designate the substrate and the first (or positive) electrode, respectively, which are the same as in FIG. 1. Reference numeral 3 designates a luminescence layer composed of a layer 3a and a layer 3b. The layer 3a is the first layer comprising the first organic compound having positive-hole-transporting and luminous properties. The thickness of this layer is generally 100 Å to 2000 Å, preferably 200 Å to 1000 Å. The layer 3b is the second layer comprising the second organic compound having an electron-transporting property. The thickness of this layer is generally 100 Å to 1500 Å, preferably 200 Å to 1000 Å. The ratio of the two organic compounds contained in these layers is also 10/90 to 90/10 on a weight basis. The first layer 3a and the second layer 3b can be overlaid in any order.

It is preferable that the first organic compounds be amorphous in a solid state and can emit intense fluorescent light. Examples of such organic compounds include triphenyl amine compounds, stilbene derivatives, and pyrazoline derivatives. Specific examples of these compounds are as follows:

[Triphenyl Amine Compounds]

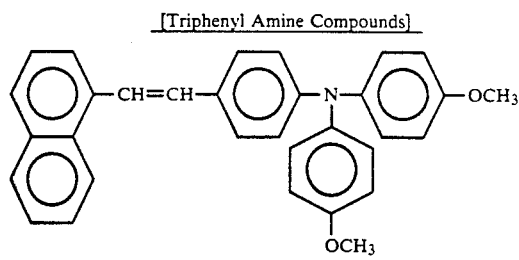 (i)

[Stilbene Derivatives]

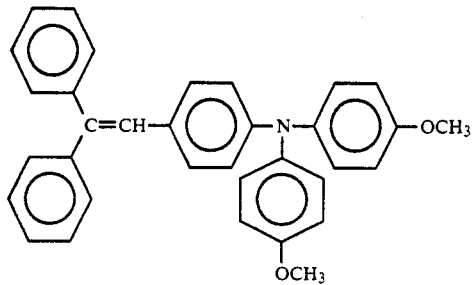 (ii)

[Pyrazoline Derivatives]

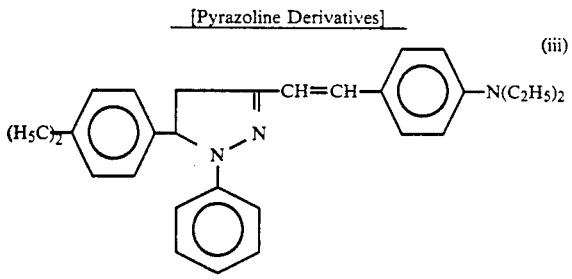 (iii)

Those organic compounds which can fulfill the following requirements can be used as the second organic compound having electron-transporting property:

(1) having high ability of injecting electrons into the positive-hole-transporting layer;

(2) preventing the migration of a luminescent material excited in the positive-hole-transporting layer into the electron-transporting layer; and (3) capable of being made into a thin film by vacuum deposition.

Among the organic compounds having the above characteristics, an oxadiazole derivative having the following formula are preferably employed in the present invention.

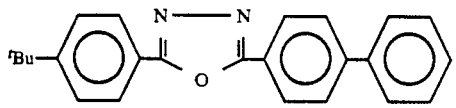

The oxadiazole derivative can cause almost all organic compounds having positive-hole-transporting and luminous properties to emit light when the energy level between the positive-hole-transporting layer and the electron-transporting layer is properly controlled.

As mentioned previously, the weight ratio of the first organic compound having positive-hole-transporting and luminous properties to the second organic compound having electron-transporting property can be changed from 10/90 to 90/10.

The luminescence layer can be formed by any conventional methods such as vacuum deposition, coating method and melting method.

When vacuum deposition is employed to form the luminescence layer, for instance, the following methods can be employed.

(1) A first organic compound having positive-hole-transporting and luminous properties and a second organic compound having electron-transporting property are simultaneously deposited on a substrate by using two different evaporating sources which can heat the organic compounds to predetermined temperatures respectively to control the deposition speed of each compound independently.

When the deposition speed of each organic compound is varied while the deposition is conducted, a luminescence layer having a different composition in the direction of the thickness thereof can be obtained.

(2) The first and second organic compounds are mixed in advance, and the mixture is deposited on the substrate by using one evaporating source.

In FIGS. 1 and 2, reference numeral 4 designates a second (or negative) electrode. The second electrode 4 can be provided by depositing metals or organic electroconductive materials by vacuum deposition. Those metals having the low work function such as Mg, Al, Ag and In are preferably employed as the second electrode in the present invention. The second electrode is formed on the luminescence layer using, for example, the metal by vacuum deposition.

In order to improve the durability and the light-emitting efficiency of the electroluminescence device of the present invention, one or more layers made of organic materials may be interposed between the first electrode and the luminescence layer and/or between the second electrode and the luminescence layer.

Since the electroluminescence devices of the present invention have the above simple structure, they can be produced easily, and can emit light with high luminous intensity; and their light-emitting characteristics last for a prolonged period of time.

Other features of this invention will become apparent in the course of the following description of exemplary embodiments, which are given for illustration of the invention and are not intended to be limiting thereof.

EXAMPLE 1

A glass plate deposited with indium—tin oxide (ITO) (made by HOYA Corporation), which is referred to as the ITO glass substrate and serves as a first (positive) electrode, was washed with a neutral detergent, and then subjected to ultrasonic cleaning in ethanol for approximately 10 minutes. The ITO glass substrate thus cleaned was dipped in boiled ethanol for about one minute, and then dried in the blowing air.

An organic compound having positive-hole-transporting and luminous properties, having formula H-1, was placed in a tantalum boat serving as an evaporating source, and was heated to a predetermined temperature to control its deposition speed. Thus, the compound H-1 was deposited on the ITO glass substrate to form a positive-hole-transporting layer.

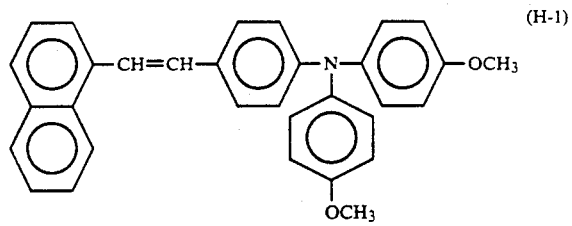

(H-1)

More specifically, the temperature of the tantalum boat charged with the compound H-1 was maintained at 200° C. by a temperature controller to adjust its deposition speed to 2 Å/second. The vacuum degree at the time of the vacuum deposition was $0.7 \times 10^{-6}$ Torr, and the temperature of the ITO glass substrate was 20° C. The thickness of the positive-hole-transporting layer thus formed on the ITO glass substrate was 500 Å.

An oxadiazole derivative having formula E, which is an organic compound having electron-transporting property, was placed in a tantalum boat serving as an evaporating source, and was heated to a predetermined temperature to control its deposition speed. Thus, the compound E was deposited on the positive-hole-transporting layer to form an electron-transporting layer having a thickness of 500 Å. Namely, the temperature of the tantalum boat charged with the compound E was maintained at 150° C. to adjust its deposition speed to 2 Å/second.

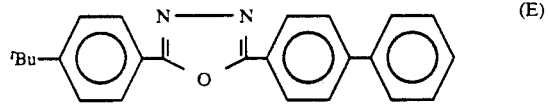

(E)

On the electron-transporting layer, an Mg-Ag (second) electrode with an area of 0.1 cm$^2$ and a thickness of 1500 Å was formed by vacuum deposition, whereby electroluminescence device No. 1 according to the present invention was obtained.

The device thus obtained emitted green light having a light intensity peak at 500 nm when a positive bias voltage was applied to the ITO glass substrate side. The device emitted light with a luminous intensity of 1000 cd/m$^2$ when an electromotive force of 12V with a current density of 100 mA/cm$^2$ was applied thereto. The device emitted light with a luminous intensity of 2000 cd/m$^2$ when an electromotive force of 12V with a current density of 200 mA/cm$^2$ was applied thereto. Furthermore, the luminous intensity of 100 cd/m$^2$ emitted by the device was not decreased even when the device was operated with application of an electric current with a current density of 10 mA/cm$^2$ for 40 hours. The device functioned normally in the completely dried air.

EXAMPLE 2

The procedure in Example 1 was repeated except that the organic compound H-1 used in Example 1 was replaced by a stilbene derivative having formula H-2 and the temperature of the boat charged with this compound was maintained at 220° C., whereby electroluminescence device No. 2 according to the present invention was prepared.

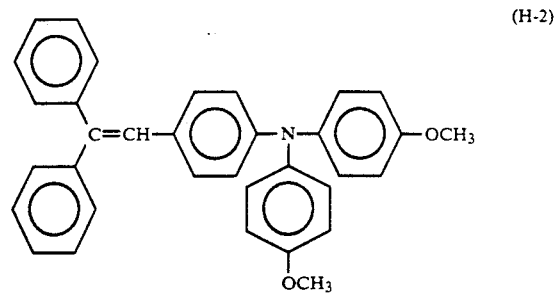

(H-2)

The device emitted green light having a light intensity peak at 500 nm when a positive bias voltage was applied to the ITO glass substrate side. Furthermore, the device emitted light with a luminous intensity of 500 cd/m$^2$ when an electromotive force of 13V with a current density of 100 mA/cm$^2$ was applied thereto. The device functioned normally in the completely dried air.

EXAMPLE 3

The procedure in Example 1 was repeated except that the organic compound H-1 used in Example 1 was replaced by a pyrazoline derivative having formula H-3 and the temperature of the boat charged with this compound was maintained at 220° C., whereby electroluminescence device No. 3 according to the present invention was prepared.

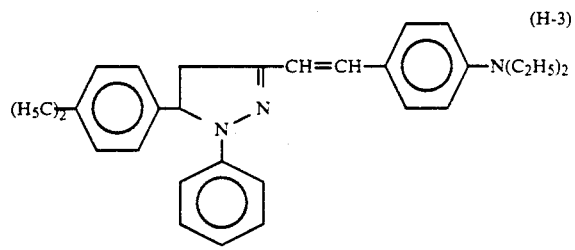

(H-3)

The device emitted green light having a light intensity peak at 520 nm when a positive bias voltage was applied to the ITO glass substrate side. Furthermore, the device emitted light with a luminous intensity of 500 cd/m$^2$ when an electromotive force of 15V with a current density of 100 mA/cm$^2$ was applied thereto. The device functioned normally in the completely dried air.

What is claimed is:

1. An electroluminescence device comprising:
   a positive electrode;
   a luminescence layer in direct contact with said positive electrode, said luminescence layer consisting of a first organic compound having positive-hole transport and luminous properties selected from the group consisting of

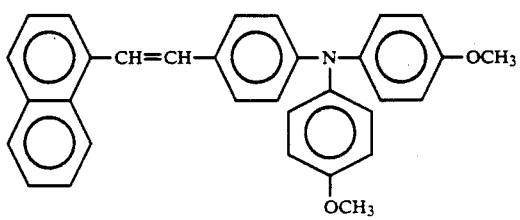

,

-continued

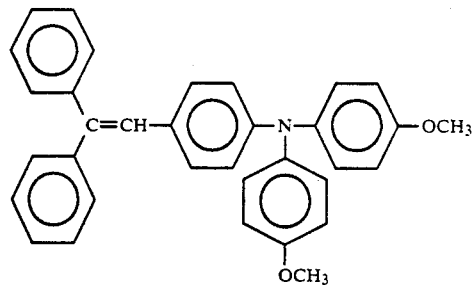
and

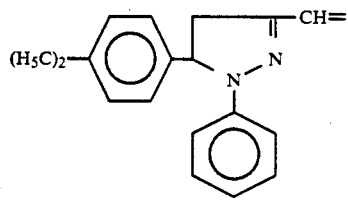

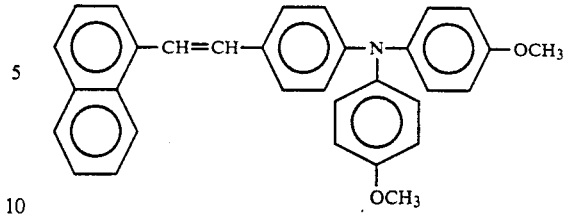

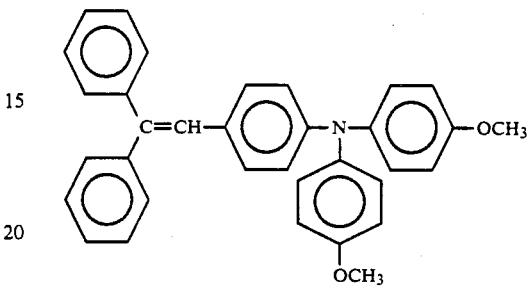
and

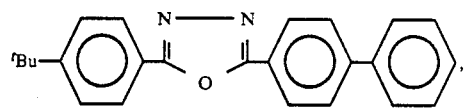

and a second organic compound having electron-transporting property of the formula

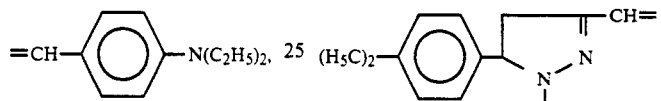

wherein ᵗBu is tert-butyl; and a negative electrode in direct contact with said luminescence layer.

2. The device as claimed in claim 1, wherein said luminescence layer has a thickness of 200 Å to 3000 Å.

3. The device as claimed in claim 1, wherein the weight ratio of said organic compound to said second organic compound, in said luminescence layer, is in the range of 10/90 to 90/10.

4. The device as claimed in claim 1, wherein said positive electrode comprises a material selected from the group consisting of gold, platinum, palladium, tin oxide, indium-tin oxide and an organic electroconductive material.

5. The device as claimed in claim 1, wherein said positive electrode is transparent to light having a wavelength of 400 nm or more.

6. The device as claimed in claim 1, wherein said negative electrode comprises a material selected from the group consisting of Mg, Al, Ag and In.

7. An electroluminescence device comprising:
 a positive electrode;
 a luminescence layer comprising
  a first layer in direct contact with said positive electrode, said first layer consisting of a first organic compound having positive-hole transporting and luminous properties selected from the group consisting of

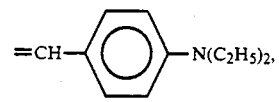

and a second layer in direct contact with said first layer, said second layer consisting of a second organic compound having electron-transporting property of the formula

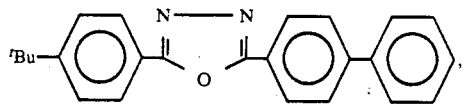

wherein ᵗBu is tert-butyl; and a negative electrode in direct contact with said second layer.

8. The device as claimed in claim 7, wherein said first layer has a thickness in the range of 100 Å to 2000 Å.

9. The device as claimed in claim 7, wherein said second layer has a thickness in the range of 100 Å to 1500 Å.

10. The device as claimed in claim 7, wherein said positive electrode comprises a material selected from the group consisting of gold, platinum, palladium, tin oxide, indium-tin oxide and an organic electroconductive material.

11. The device as claimed in claim 7, wherein said positive electrode is transparent to light having a wavelength of 400 nm or more.

12. The device as claimed in claim 7, wherein said negative electrode comprises a material selected from the group consisting of Mg, Al, Ag and In.

* * * * *